United States Patent
Chen et al.

(10) Patent No.: US 6,816,748 B1
(45) Date of Patent: Nov. 9, 2004

(54) SMART AUTOMATIC RECORDING SYSTEM AND METHOD FOR MONITORING WAFER FRAGMENTATION

(75) Inventors: Ting Kuo Chen, Tainan (TW); Wen Chin Kuo, Hsinchu (TW); Yong Sen Liao, Miao Li Hsien (TW); Chun Chieh Lin, Chia Yi Hsien (TW)

(73) Assignee: Winbond Electronics Corp., Hsinchu (TW)

( * ) Notice: Subject to any disclaimer, the term of this patent is extended or adjusted under 35 U.S.C. 154(b) by 797 days.

(21) Appl. No.: 09/686,895

(22) Filed: Oct. 12, 2000

(51) Int. Cl.[7] ............................................. G06F 19/00
(52) U.S. Cl. ...................................... 700/110; 700/121
(58) Field of Search ................ 700/117–121, 108–110; 356/237.3–237.5; 382/144–149; 348/125, 126, 128

(56) References Cited

U.S. PATENT DOCUMENTS

| | | | | |
|---|---|---|---|---|
| 4,638,289 A | * | 1/1987 | Zottnik | 246/45 |
| 5,644,140 A | * | 7/1997 | Biedermann et al. | 250/559.08 |
| 6,064,429 A | * | 5/2000 | Belk et al. | 348/128 |
| 6,163,338 A | * | 12/2000 | Johnson et al. | 348/148 |
| 6,265,736 B1 | * | 7/2001 | Dillen et al. | 257/232 |
| 6,452,150 B1 | * | 9/2002 | Mori et al. | 250/208.1 |
| 6,535,628 B2 | * | 3/2003 | Smargiassi et al. | 382/149 |

FOREIGN PATENT DOCUMENTS

WO   WO 00/22655   * 4/2000

* cited by examiner

Primary Examiner—Maria N. Von Buhr
(74) Attorney, Agent, or Firm—Rosenberg, Klein & Lee

(57) ABSTRACT

The present invention proposes a smart automatic recording system and method for monitoring wafer fragmentation, which system comprises a plurality of photographing devices, a multiple-image transmitter, a multiple-image receiver, and a PC. The photographing devices are used to monitor the circumstances when wafers are polished. The photographed images are then transferred to the multiple-image receiver by the multiple-image transmitter. After the multiple-image receiver receives the image signals, it merges the images captured at the same time into the same image frame. Next, the multiple-image receiver transfers the image signal to the input terminal of an image-capturing card in the PC. The PC also receives the wafer-entry and wafer-exit signals and the signal of wafer fragmentation transferred from the port of the polishing apparatus. The present invention can be exploited to facilitate judgement, diagnosis, genuine factor verification, or engineering improvement and management for associated technicians.

12 Claims, 4 Drawing Sheets

SMART AUTOMATIC RECORDING SYSTEM AND METHOD FOR MONITORING WAFER FRAGMENTATION

FIELD OF THE INVENTION

The present invention relates to a smart automatic recording system and method for monitoring wafer fragmentation to facilitate judgement, diagnosis, genuine factor verification, or engineering improvement and management for associated technicians by using photographing devices and a personal computer (PC).

BACKGROUND OF THE INVENTION

Because the perspectives of wafer factories are good and their throughputs expand continually, there is an abrupt increase in the equipment quantities and the degree of machine automation. However, the required training of technicians becomes more cumbersome, and it is difficult to reckon with machine anomalies occurring seldom such as wafer fragmentation or malfunction by long-term in-situ monitoring. Therefore, although the CMP (chemical mechanic polishing) Ebara machine has good stability, the problems of wafer fragmentation and wafer dropping due to unknown reasons may still occur.

To effectively inspect the reasons of wafer fragmentation and wafer dropping, the expedient is to perform the machine monitoring. However, the efficiency of using manpower for stationing or a recorder for recording is much unsatisfactory, and it is difficult to circularize and examine the data among many people. Moreover, the storage and management of data will be very bothersome.

SUMMARY AND OBJECTS OF THE PRESENT INVENTION

Accordingly, the primary object of the present invention is to provide a smart automatic recording system and method for monitoring wafer fragmentation to facilitate judgement, diagnosis, genuine factor verification, or engineering improvement and management for associated technicians.

The secondary object of the present invention is to provide a smart automatic recording system and method for monitoring wafer fragmentation, wherein only the image of a fragmentized wafer and the two images before it will be recorded. Therefore, cheap and convenient factor analysis can be obtained, and the space of the hard disk will not be wasted.

The various objects and advantages of the present invention will be more readily understood from the following detailed description when read in conjunction with the appended drawings, in which:

DETAILED DESCRIPTION OF PREFERRED EMBODIMENT

Figure 1:
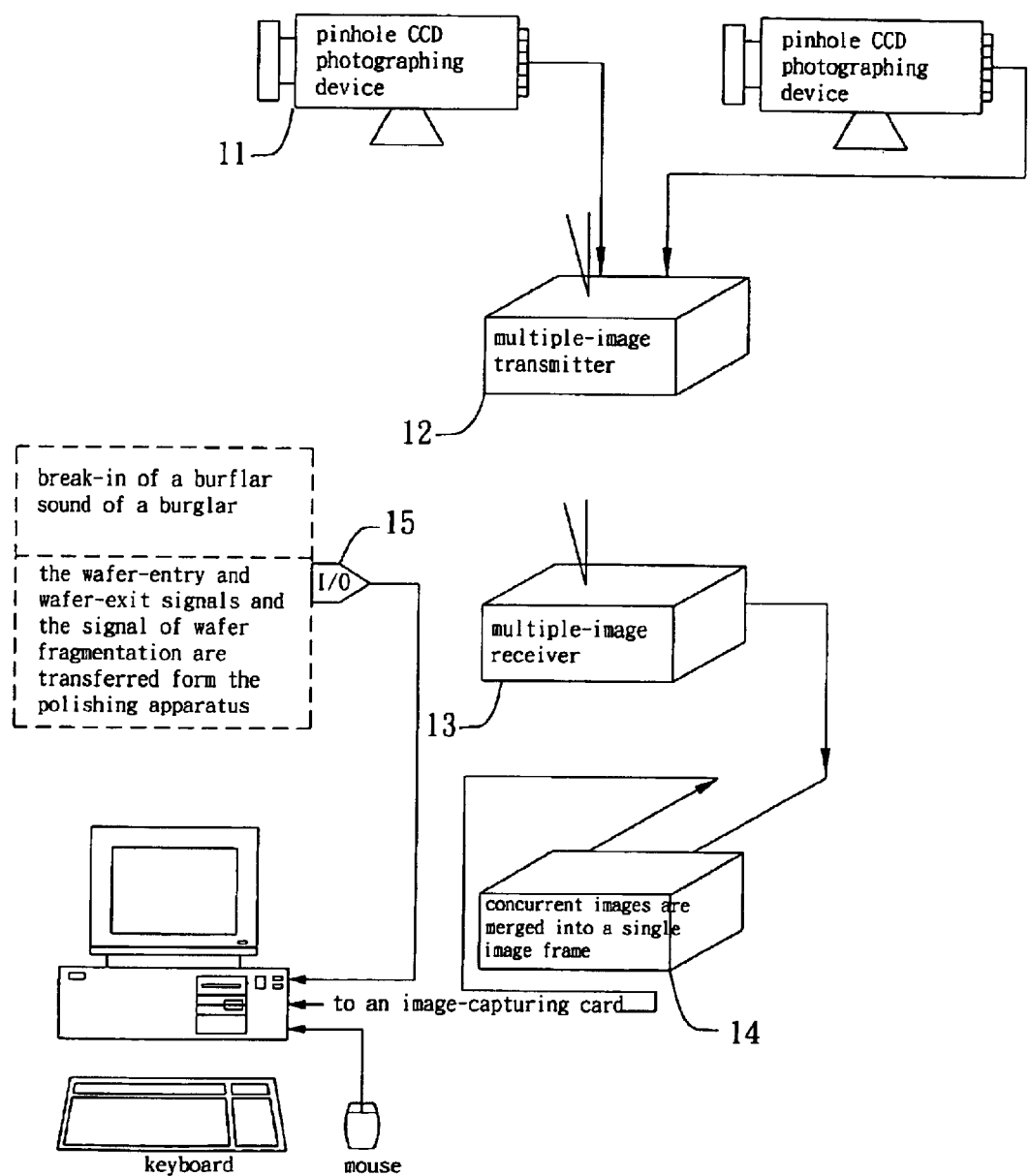
FIG. 1 is a diagram showing the actual hardware connection of the present invention.

As shown in FIG. 1, a smart recording system for monitoring wafer fragmentation according to a preferred embodiment of the present invention comprises a plurality of photographing devices 11 such as CCD (charge coupled device) cameras or general recorders so that the circumstances can be monitored when wafers are polished. The photographed images are then transferred to a multiple-image receiver 13 by a multiple-image transmitter 12. The photographed images are digitized and recorded simultaneously by a plurality of photographing devices. After the multiple-image receiver 13 receives the image signals, the images captured at the same time will be merged into the same image frame 14 by the multiple-image receiver 13. Next, the multiple-image receiver 13 transfers the image signals to the input terminal of an image-capturing card in a PC. The PC also receives the wafer-entry and wafer-exit signals and the signal of wafer fragmentation transferred from the I/O (input/output) port of a polishing apparatus. A whole monitoring system is thus formed.

Figure 2:
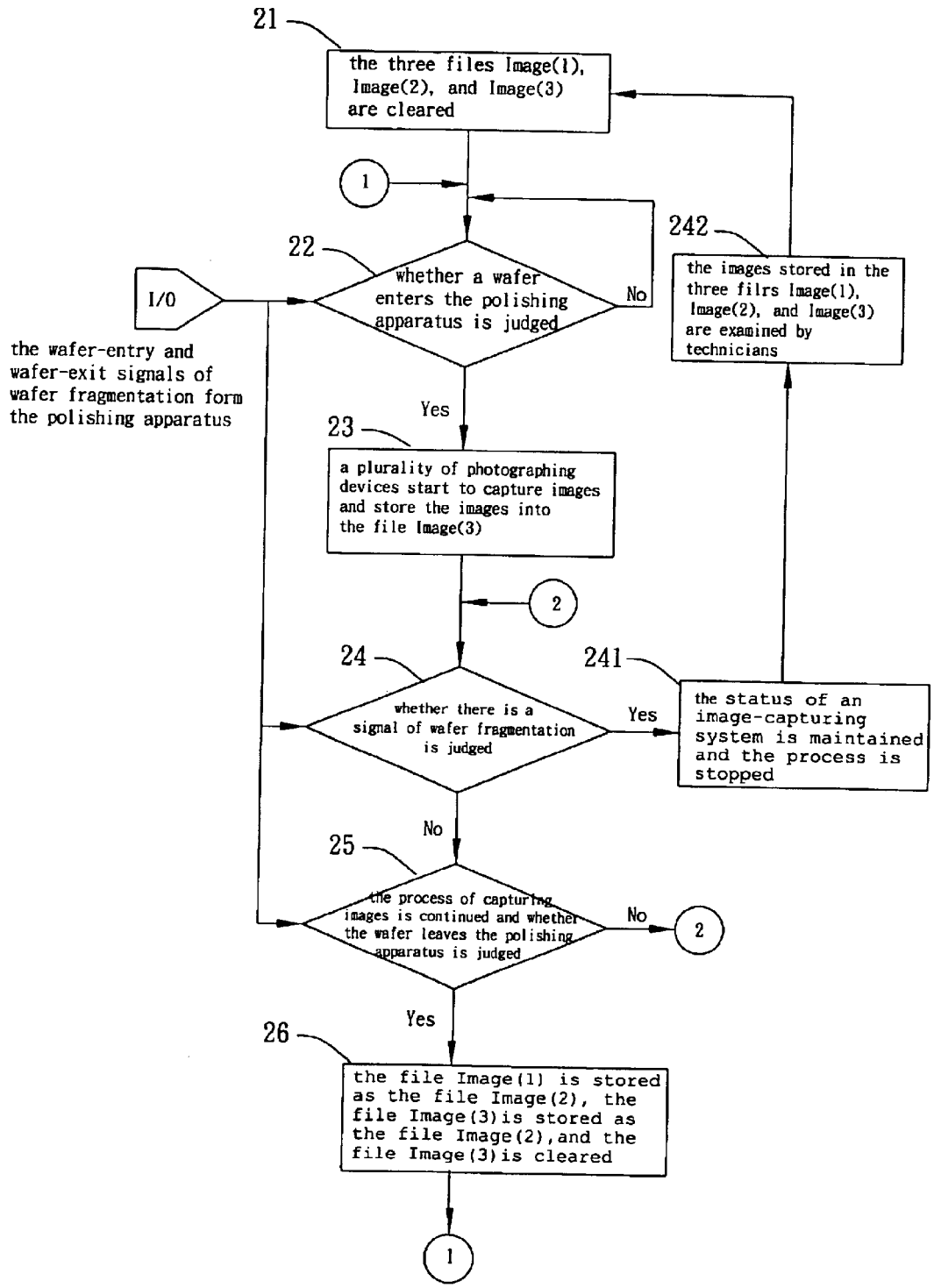
FIG. 2 is a flowchart of a smart automatic recording method for monitoring wafer fragmentation according to an embodiment of the present invention.

Please refer to FIG. 2. Three files Image(1), Image(2), and Image(3) set in the PC are first cleared (Step 21). A wafer-entry signal will be transferred to the PC by the polishing apparatus when a wafer enters the polishing apparatus (Step 22). The PC will issue instructions to the photographing devices to let them start to capture images and store the images into the file Image(3) (Step 23). The wafer will proceed to the polishing position and then leave the polishing apparatus when the polishing work is finished. From the moment when the wafer enters the polishing apparatus to the moment when it leaves the polishing apparatus, the photographing devices photograph and monitor uninterruptedly, with the photographed images shiftably stored in the three files Image(1), Image(2), and Image(3) in the order of Image(3), Image(2), and Image(1). Speaking more clearly, when a new image is received, the image in Image(2) will be stored in Image(1), the image in Image (3) will be stored in Image(2), and the new image will be stored in Image (3). The photographing devices photograph the polishing process of a wafer until the PC receives a signal of wafer fragmentation or a wafer-exit signal from the polishing apparatus. When the situation of wafer fragmentation occurs (Step 24), an image-capturing system will maintain the status and stop the process (Step 241) so that technicians can analyze the images stored in the three files Image(1), Image (2), and Image(3) to find out the reason of wafer fragmentation easily (Step 242). After the problem has been resolved, the polishing process will be continued. Contrarily, if the polishing process is successful so that the situation of wafer fragmentation does not arise, the file Image(2) will be stored as the file Image(1), the file Image(3) will be stored as the file Image(2), and the file Image(3) will be cleared. The above procedures are repeated until the polishing work of the whole batch of wafers is finished.

Figure 3:
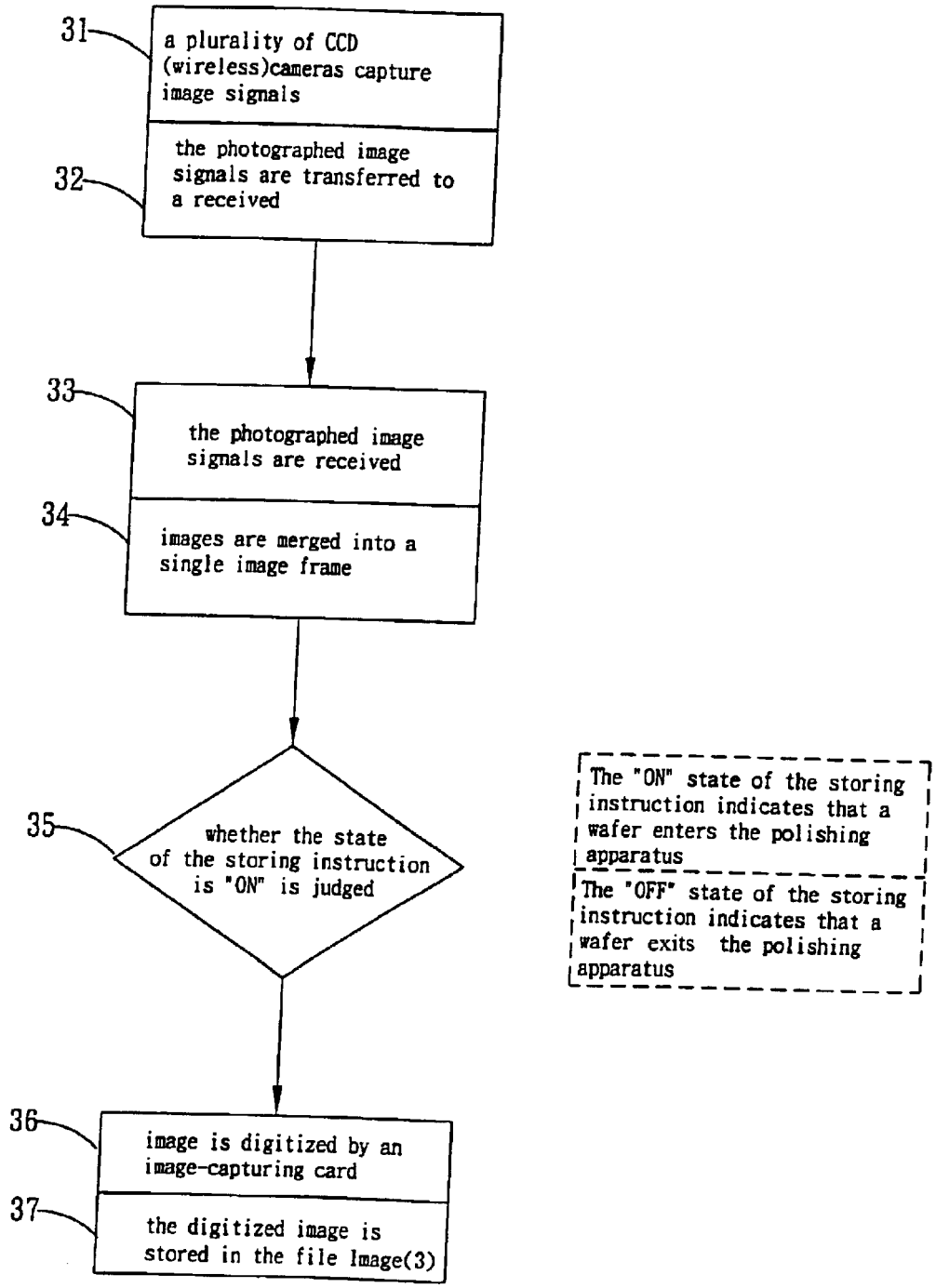
FIG. 3 shows the process to capture, merge, and store the images of wafers; and, FIG. 4 shows the process performed by means of IC (integrated circuit) design and a control card to capture, merge, and store the image of wafers.

FIG. 3 shows the process to capture, merge, and store the images of wafers, which process comprises the steps of:

(1). capturing an image signal by a plurality of photographing devices;

(2). transferring the image signal to an image receiver;

(3). receiving the image signal by the image receiver;

(4). merging the images captured at the same time into the same image frame by the image receiver;

(5). judging whether a wafer enters the polishing apparatus (judging whether the state of the store instruction is "ON");

(6). digitizing the captured image by an image-capturing card in a PC when a wafer enters the polishing apparatus;

(7). storing the digitized image into a file Image(3) set in the PC.

The photographing device used in Step (5) to judge whether a wafer enters the polishing apparatus can be a CCD camera. The judgement can be made according to the signal transferred from the I/O port of the polishing apparatus. After the image-capturing system in Step (4) maintains the status and stops the process, technicians can examine the reason of wafer fragmentation to resolve the problem so that normal polishing process can then be continued.

Figure 4:
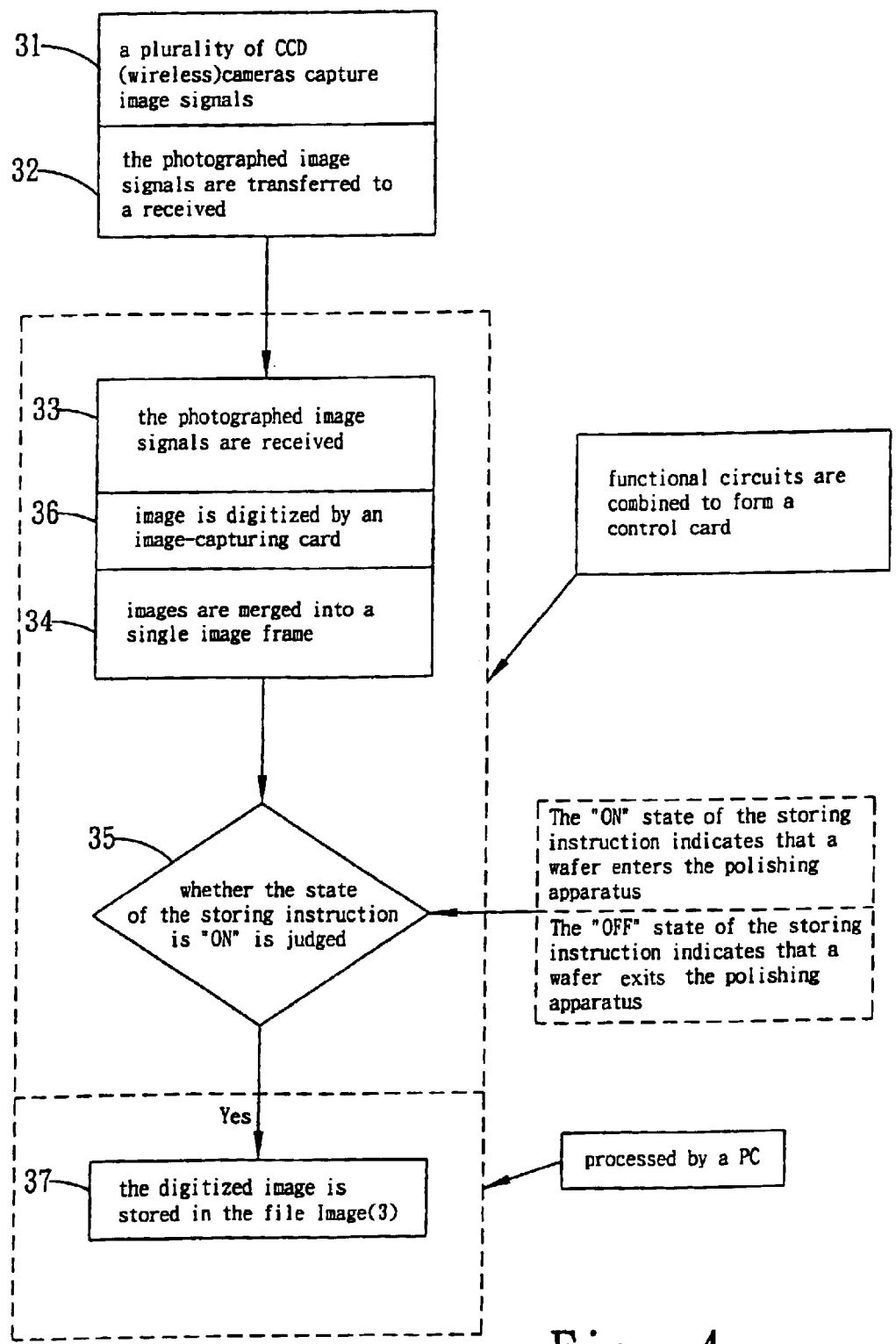

FIG. 4 shows the process performed by means of IC design and a control card to capture, merge, and store the image of wafers. The functional circuits of the above steps (3) to (7) are combined to form a control card so that a more compact system can be obtained.

Although the present invention has been described with reference to the preferred embodiments thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

We claim:

1. A smart recording system for monitoring wafer fragmentation, comprising:
    a plurality of photographing devices for simultaneously monitoring a wafer during processing thereof in a polishing apparatus;
    a multiple-image transmitter for transferring respective image frames generated by said photographing devices;
    a multiple-image receiver for receiving image frames transferred from said multiple-image transmitter and merging simultaneously captured ones thereof into a common image frame; and,
    a personal computer having an image-capturing card for storing the common image frame formed by said multiple-image receiver in a sequentially shifted manner through an image file set having a predetermined frame capacity, said personal computer being operable to selectively activate and deactivate the photographing devices responsive to entry and exit of a wafer relative to the polishing apparatus, and responsive to an occurrence of wafer fragmentation within the polishing apparatus.

2. The smart recording system for monitoring wafer fragmentation as claimed in claim 1, wherein said photographing devices are CCD cameras.

3. The smart recording system for monitoring wafer fragmentation as claimed in claim 1, wherein said personal computer is coupled to an I/O port of the polishing apparatus to receive a signal therefrom indicative of the entry and exit of the wafer relative to the polishing apparatus.

4. A smart recording method for monitoring wafer fragmentation, comprising the steps of:
    (1). clearing image data from three files Image(1), Image(2), and Image(3) set in a personal computer;
    (2). determining whether a wafer enters a polishing apparatus;
    (3). selectively activating a simultaneous capturing of respective images frames by a plurality of photographing devices responsive to entry of a wafer into the polishing apparatus, and merging and storing the respective image frames into a common image frame in said file Image(3);
    (4). determining whether wafer fragmentation has occurred within the polishing apparatus; selectively deactivating the image-capturing responsive to a determination of wafer fragmentation occurrence
    (5). continuing a sequential capture of images frames by said photographing devices in the absence of a wafer fragmentation within the polishing apparatus, determining whether the wafer exits the polishing apparatus, and deactivating the capture of image frames responsive to the wafer exiting the polishing apparatus;
    (6). storing in sequentially shifted manner an image data content of said file Image(2) into said file Image(1), storing in sequentially shifted manner an image data content of said file Image(3) into said file Image(2), and clearing image data from said file Image(3); and,
    (7). repeating said Steps (2) to (6) for each of a batch of wafers.

5. The smart recording method for monitoring wafer fragmentation as claimed in claim 4, wherein said photographing device used in said Step (5) is a CCD camera.

6. The smart recording method for monitoring wafer fragmentation as claimed in claim 4, wherein the determination in said Step (2) is made according to a wafer-entry signal transferred from an I/O port of the polishing apparatus.

7. The smart recording method for monitoring wafer fragmentation as claimed in claim 4, wherein the determination in said Step (4) is made according to a wafer-fragmentation signal transferred from an I/O port of the polishing apparatus.

8. The smart recording method for monitoring wafer fragmentation as claimed in claim 4, wherein the determination in said Step (5) is made according to a wafer-exit signal transferred from an I/O port of the polishing apparatus.

9. The smart recording method for monitoring wafer fragmentation as claimed in claim 4, wherein after deactivation of said image-capturing in said Step (4), the image data content of said files Image(1), Image(2), and Image(3) are provided for user examination.

10. The smart recording method for monitoring wafer fragmentation as claimed in claim 9, wherein said Step (1) is subsequently executed for another wafer in the batch following user examination of a preceding wafer at Step (4).

11. A storing method of wafer images, comprising the steps of:
    (1). setting a predetermined parameter to a first state responsive to entry of a wafer into a polishing apparatus and to a second state responsive to exit of the wafer therefrom;
    (2). selectively activating and deactivating simultaneous capturing of respective image signals by a plurality of photographing devices responsive to the predetermined parameter being respectively in said first and second states, the capturing of image signals being automatically interrupted responsive to detection of wafer fragmentation;
    (3). transferring the image signals to an image receiver;
    (4). receiving the image signals by said image receiver;
    (5). merging the images derived from the image signals captured at the same time into a common image frame by said image receiver;
    (6). digitizing the common image frame by an image-capturing card in a PC when the predetermined parameter is in said first state; and,
    (7). storing said digitized common image frame in a sequentially shifted manner through an image file set having a predetermined frame capacity in said PC.

12. The storing method as claimed in claim 11, wherein said photographing devices are CCD cameras.

* * * * *